United States Patent [19]

Kobayashi

[11] Patent Number: 4,858,188
[45] Date of Patent: Aug. 15, 1989

[54] SEMICONDUCTOR MEMORY WITH IMPROVED WRITE FUNCTION

[75] Inventor: Yasuo Kobayashi, Tokyo, Japan
[73] Assignee: NEC Corporation, Tokyo, Japan
[21] Appl. No.: 93,833
[22] Filed: Sep. 8, 1987
[30] Foreign Application Priority Data
 Sep. 9, 1986 [JP] Japan .................. 61-213159
[51] Int. Cl.$^4$ .............................. G11C 7/00
[52] U.S. Cl. .................. 365/189.05; 365/190; 365/189.07
[58] Field of Search .............. 365/190, 195, 205, 207, 365/208, 230, 233, 189

[56] References Cited

U.S. PATENT DOCUMENTS 4,573,147 2/1986 Aoyama et al. .................. 365/190
4,665,507 5/1987 Gondou et al. .................. 365/190

FOREIGN PATENT DOCUMENTS

0014396 1/1983 Japan .................. 365/190
0053082 3/1983 Japan .................. 365/190

Primary Examiner—Stuart N. Hecker
Assistant Examiner—Glenn A. Gossage
Attorney, Agent, or Firm—Sughrue, Mion, Zinn, Macpeak & Seas

[57] ABSTRACT

A static memory which can operate with a small power consumption and produces at an output terminal the same data that is written into a selected memory cell, is disclosed. The memory comprises a memory array, a sense amplifier, a latch circuit for holding data from the sense amplifier and a data-in buffer for generating a buffered input signal, and is featured by a circuit for directly writing the buffered input signal to the latch circuit in a write mode.

5 Claims, 10 Drawing Sheets

FIG.21

SEMICONDUCTOR MEMORY WITH IMPROVED WRITE FUNCTION

BACKGROUND OF THE INVENTION

The present invention relates to a memory circuit and more particularly to a static memory circuit of an asynchronous type.

Asynchronous type static memories are known and widely used as high speed memories. The asynchronous type static memory operates without receiving any clock signal from the outside memory; it generates timing signals for controlling the respective sections in accordance with changes in address signals and a write enable signal. However, in the prior art the respective peripheral circuits of the memory are controlled in the same manner both in a read operation and in a write operation, and a sense amplifier is also enabled in a write operation even though a function of the sense amplifier is not necessary in a write operation, resulting in large power consumption.

Also, it is frequently required to output the same data written into a selected memory cell to an output terminal. To that end, after the write operation, the same word line is selected again to perform a read operation on the same memory cell which was selected in the previous write operation. Thus, the reading of the written data cannot be performed at a high speed and such read operation also has a large power consumption.

SUMMARY OF THE INVENTION

It is an object of the present invention to provide a memory circuit which can operate in a write mode with reduced power consumption.

It is another object of the present invention to provide a memory circuit which can output the same data as that written into a selected memory cell at a high speed.

The memory according to the present invention comprises an array of memory cells, at least one sense amplifier for amplifying a signal from a selected memory cell, a data latch circuit for holding data from the sense amplifier, an output terminal from which data held at the data latch circuit is outputted, and an input buffer for generating an internal data signal responsive to an input signal from the outside, and has the feature that a circuit for applying the internal data signal to the latch circuit directly in a write mode is provided.

According to the present invention, the internal data signal is directly written into the latch circuit, and therefore the same data as the internal data signal can be outputted to the output terminal in the same write cycle.

In the present invention, in a write mode, the sense amplifier is not enabled to reduce power consumption. Also, a signal for selecting a word line is also generated when a write enable signal is enabled even if no address signal is not changed.

DETAILED DESCRIPTION OF THE INVENTION

Figure 1:
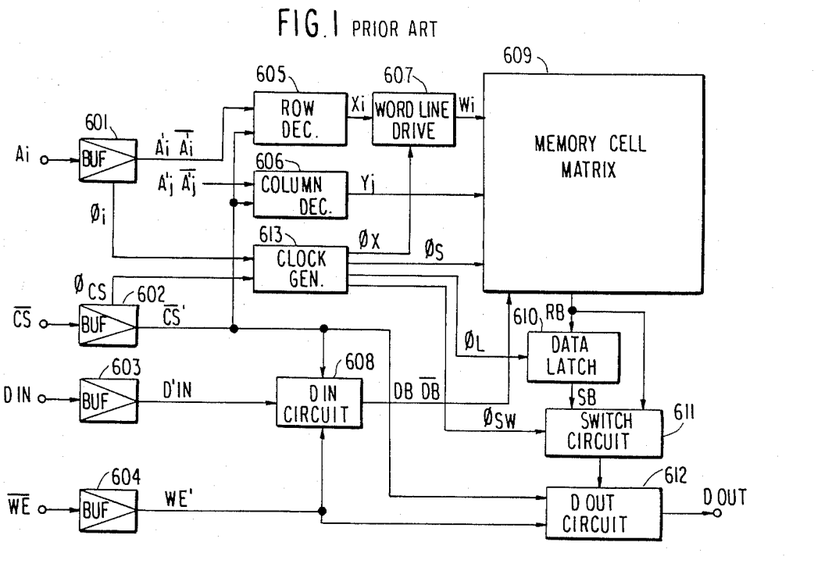
FIG. 1 is a schematic block diagram of a memory circuit according to a prior art.

Referring to FIG. 1, a memory circuit according to the prior art is explained.

A memory cell matrix 609 includes a plurality of static type memory cells in a known way.

Figure 2:
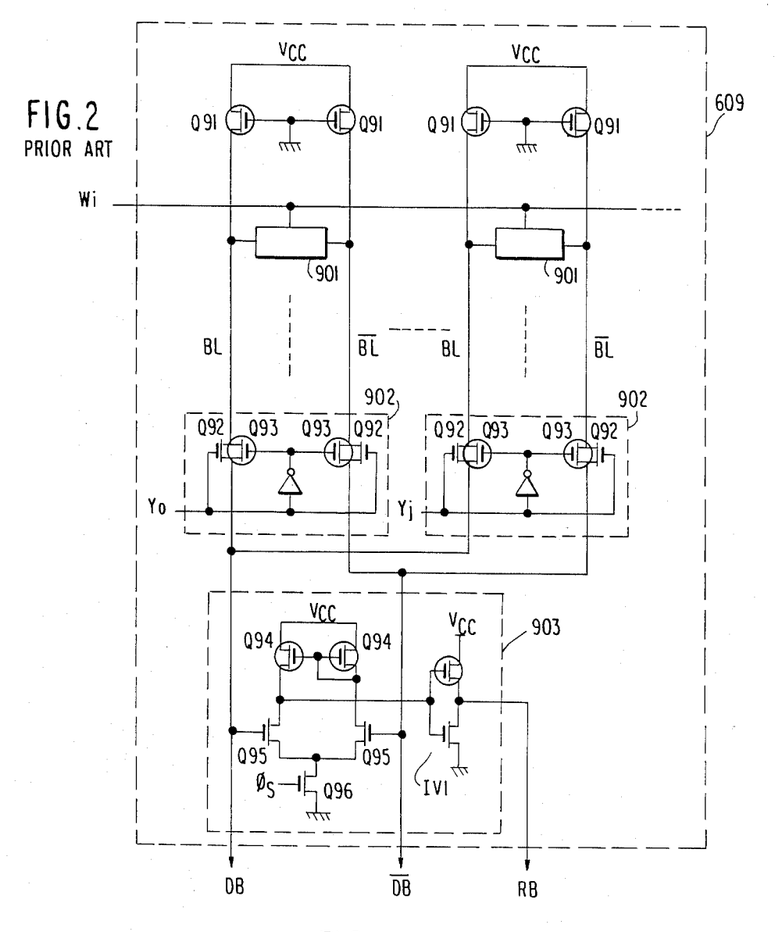
FIG. 2 is a schematic circuit diagram of a memory cell matrix.
Figure 3:
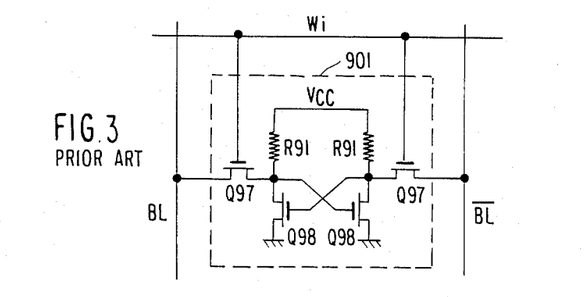
FIG. 3 is a schematic circuit diagram of a memory cell.

FIG. 2 shows the major structure of the matrix 609. As shown in FIG. 2, a plurality of pairs of bit lines (BL, $\overline{BL}$) are arranged in parallel in the column direction while a plurality of word lines Wi are arranged in the row direction. Each of the bit lines is connected to a power voltage terminal Vcc through a P channel load transistor $Q_{91}$. In the drawings, P channel transistors are indicated with a circle while N-channel transistors are indicated without a circle. A plurality of memory cells 901 are arranged at the intersections of the word lines and the bit line pairs in a known way. Each of the memory cells 901 is shown in FIG. 3 and is composed of a pair of flip-flop transistors $Q_{98}$, a pair of resistors $R_{9/}$ and a pair of transfer gate transistors $Q_{97}$. A column selection gate 902 is provided between each pair of bit lines BL, $\overline{BL}$ and a pair of data bus lines DB, $\overline{DB}$. Each of the gates 902 includes a pair of CMOS switches, each composed of an N channel transistor $Q_{92}$ and a P channel transistor $Q_{93}$, which are controlled by a column selection signal such as Yo generated from a column decoder 606. A sense amplifier 903 includes a differential amplifier composed of transistors $Q_{94}$ to $Q_{96}$ and a CMOS inverter INV from which a read signal PB is produced.

Figure 4:
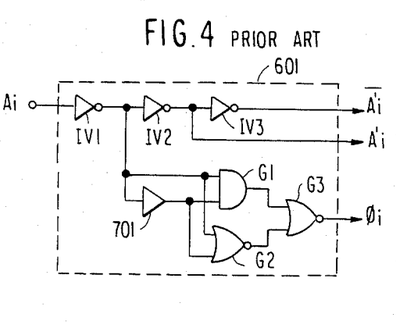
FIG. 4 is a schematic block diagram of an address buffer.

In the memory of FIG. 1, although a plurality of address input buffers are employed, one address input buffer 601 for an address input signal Ai is representatively shown. The address input buffer 609 is structured as shown in FIG. 4, in which three inverters IV1–IV3 are used to generate true and complementary address signals Ai' and $\overline{\text{Ai}}'$ and a delay circuit 701 and logic gates G1–G3 form a detection circuit for detecting a change in the address signal Ai to generate a detection signal $\phi_i$.

Figure 5:
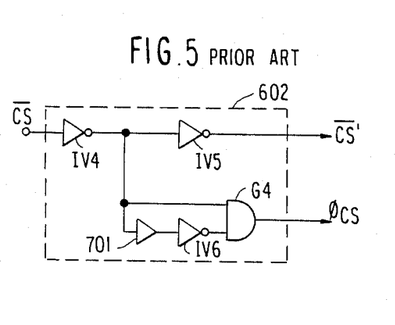
FIG. 5 is a schematic block diagram of a chip select input buffer.
Figure 6:
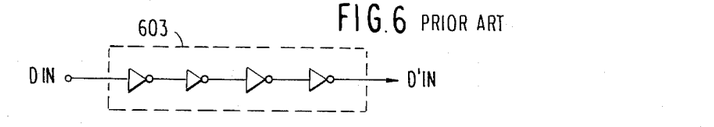
FIG. 6 is a schematic block diagram of a data input buffer.
Figure 7:
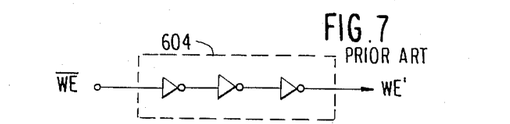
FIG. 7 is a schematic block diagram of a write control signal buffer.
Figure 8:
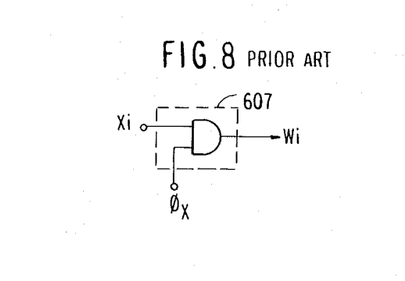
FIG. 8 is a schematic block diagram of a word line driver.

Other address buffers have the same structure as 601 but receive other address signals in a known way. A row decoder 605 receives a plurality of row address signals such as Ai', Ai' from the address buffers and generates row selection signals such as Xi of the same number as the word lines. Among the row selection signals, only one is selected with others non-selected. A word line drive circuit 607 includes a plurality of drive units each of which is structured by an AND gate receiving the row selection signal Xi and a drive timing signal $\phi_x$, an output of the AND gate being coupled to the word line Wi as shown in FIG. 8. A chip select signal buffer 602 receives a chip selection signal $\overline{\text{CS}}$ and generates an internal chip selection signal $\overline{\text{CS}}$; and a timing signal $\phi_{CS}$ when the chip selection signal $\overline{\text{CS}}$ is changed from a high inactive level to a low active level. The structure of the buffer 602 is illustrated in FIG. 5 in which inverters IV4 and IV5 are used to invert the signal $\overline{\text{CS}}$ and a delay circuit 701, an inverter IV6 and an AND gate G4 form a detection circuit for change of $\overline{\text{CS}}$. A data-in buffer 603 buffers an input data $D_{IN}$ to generate a buffered data signal $D'_{IN}$, and is structured as shown in FIG. 6. A write enable signal $\overline{\text{WE}}$ is input to a buffer 604 and an internal write signal WE' is generated therefrom. The buffer 604 is structured by three inverters as shown in FIG. 7.

Figures 11, 12, 14:
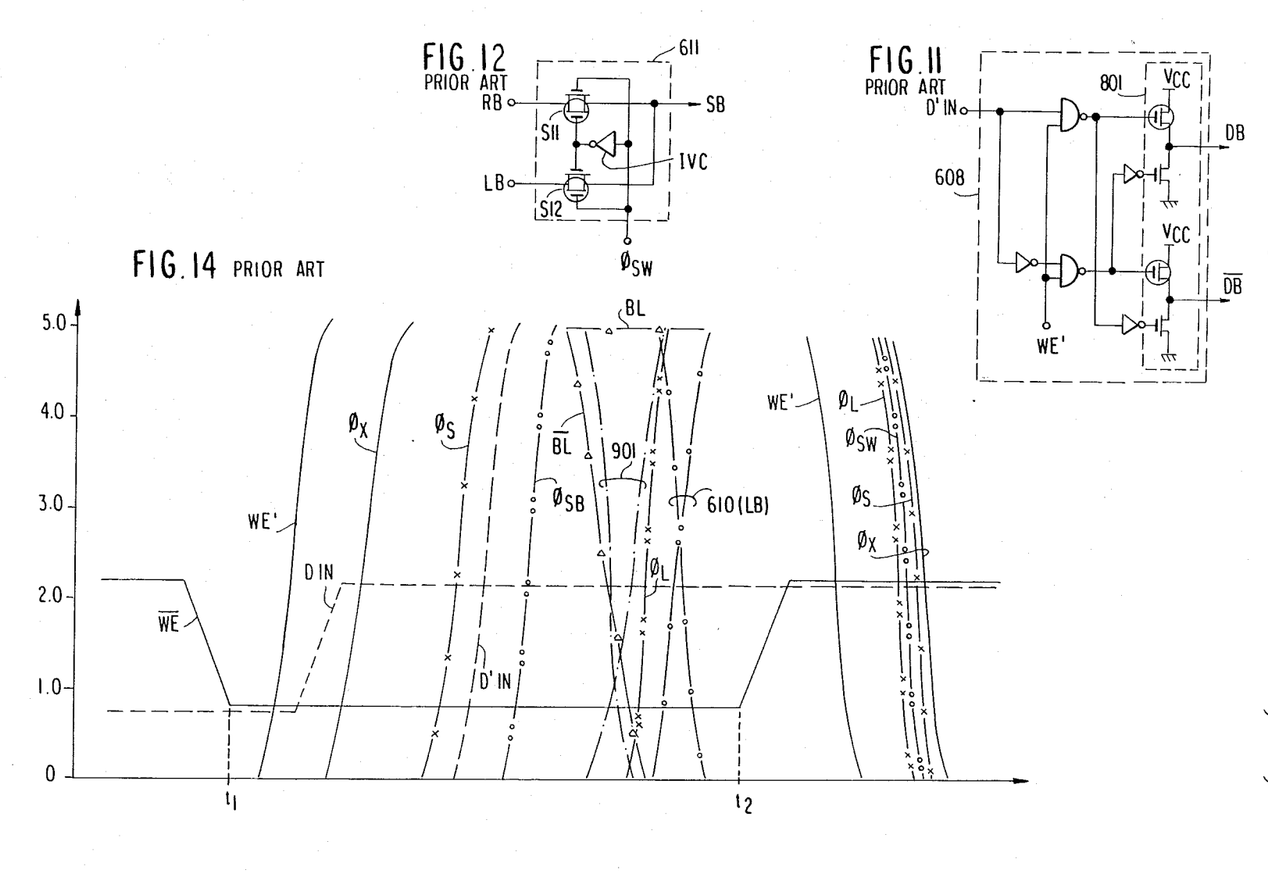
FIG. 11 is a schematic block diagram of a data input driver.
FIG. 12 is a schematic block diagram of a switching circuit.
FIG. 14 is a wave-form diagram of a write operation of the circuit in FIG. 1.

A data write circuit ($D_{IN}$) 608 receives the buffered data signal $D'_{IN}$ and the internal write signal WE' to generate true and complementary write data signals to DB and $\overline{\text{DB}}$ when WE' is high in level. The circuit 608 is structured as shown in FIG. 11 in which two CMOS inverters are employed in a driver stage 801.

A data latch circuit 610 incorporates the read signal RB through a CMOS transfer circuit 802 when a control signal $\phi_L$ is a high level and holds the signal RB by a flip-flop 803. The state of the flip-flop 803 is inputted to an inverter and outputted as a latched signal LB. A switch circuit 611 is composed of two CMOS transfer gates S11 and S12 which are controlled by a control signal $\phi_{SW}$ and its inverted signal generated by an inverter IVC, as shown in FIG. 12. When the control signal $\phi_{SW}$ is high in level, the signal RB is outputted as a selected signal SB via the transfer gate S11 when the signal $\phi_{SW}$ is at a low level, the latched signal LB is outputted via the transfer gate S12 as the signal SB. A data output circuit 612 produces an output signal $D_{OUT}$ in accordance with the signal SB when CS' is at a low level and WE' is at a low level.

Figure 10:
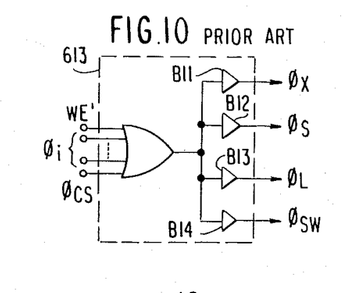
FIG. 10 is a schematic block diagram of a clock signal generator.

A clock generator 613 has an OR gate receiving the signal WE', the plurality of detection signals $\phi_i$ from all the address buffers and the signal $\phi_{CS}$ and a plurality of buffers B11 to B14 from which control signals $\phi_X$, $\phi_S$, $\phi_L$ and $\phi_{SW}$ are generated with predetermined delay times.

Figure 13:
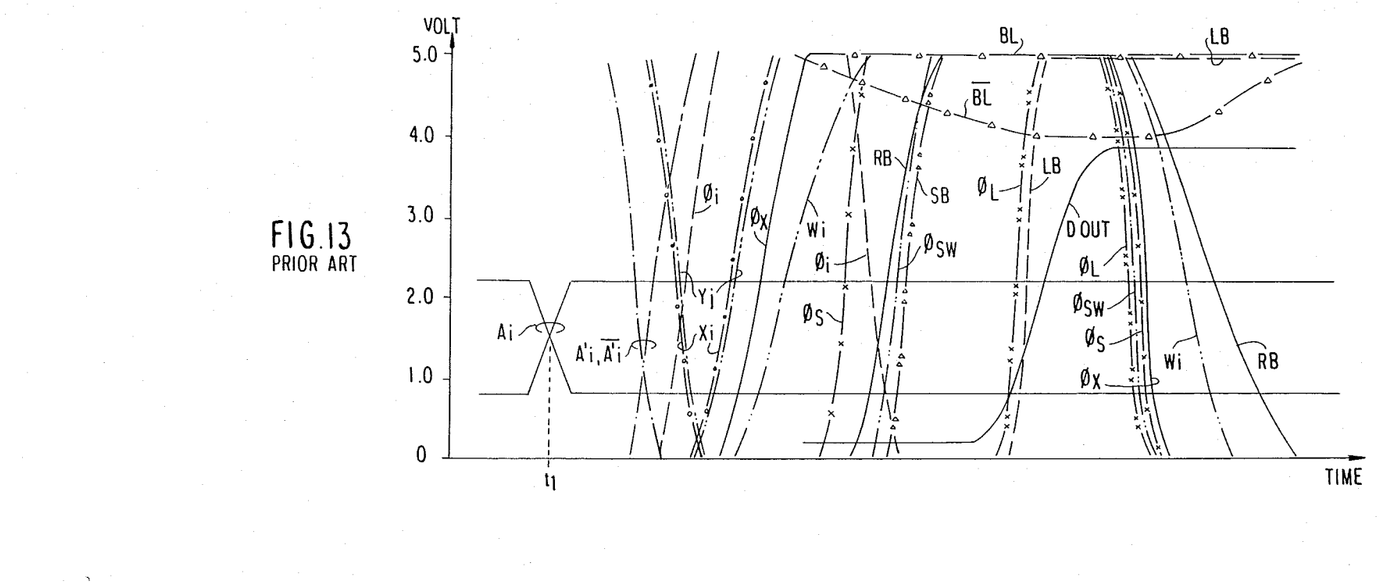
FIG. 13 is a wave-form diagram of a read operation of the circuit in FIG. 1.

A read operation of the memory of FIG. 1 is explained with reference to FIG. 13. Under the low level of $\overline{\text{CS}}$ i.e. the active state of the memory, at least one address signal Ai is changed at a time $t_1$. Thereafter, the buffered signals A'i, $\overline{\text{A}}'i$ are changed in level. Also, the detection signal $\phi_i$ of a high level is generated. The row and column decoders 605 and 606 generate the high level of selection signals Xi and Yj, respectively. Thereafter the signal $\phi_X$, $\phi_S$, $\phi_{SW}$ and $\phi_L$ are sequentially generated by the generator 613, as shown in FIG. 13. The word line Wi is selected in response to the rise of $\phi_X$ so that the states of the memory cells coupled to the selected word line Wi are generated to the respective pairs of bit lines (BL, $\overline{\text{BL}}$) and the level of the bit lines are subjected to change in level. Only one of the column selection circuit 902 is enabled so that the state of the bit line pair coupled to the enabled transfer gate 902 is transmitted to the sense amplifier 903 via DB and $\overline{\text{DB}}$ and the read signal RB is developed in response to the signal $\phi_S$. After the signal RB is developed, the signal $\phi_{SB}$ is raised and the signal RB is transmitted as the signal SB via the switch circuit 611. Thereafter, the circuit 612 produces the output signal $D_{OUT}$ in accordance with the signal SB. While, the signal $\phi_L$ is raised after the state of the signal RB and the latch circuit 610 holds the signal RB by the flip-flop 803 and the latch signal LB of the sam level as RB is produced.

Accordingly, in this instance, the read signal RB is transmitted as both of the signals SB and LB.

In the above memory, the word line Wi is selected during the period that the signal $\phi_X$ is at the high level and after this period, the output signal $D_{OUT}$ is maintained by the state of the latch circuit 610, and the signals $\phi_S$, $\phi_L$, $\phi_X$ and $\phi_{SW}$ are deactivated. Accordingly, power consumption is reduced after the deactivation of the signals $\phi_S$, $\phi_L$, $\phi_X$ and $\phi_{SW}$ although the $D_{OUT}$ is maintained.

Next, a write operation of the memory of FIG. 1 is explained with reference to FIG. 14.

Under the active level of the signal $\overline{\text{CS}}$ (low level) and the predetermined fixed state of the address signals, the write enable signal $\overline{\text{WE}}$ is changed from the inactive (high) level to the active (low) level at a time point $t_1$. Thereafter the internal write signal WE' is raised and the clock generator 603 generates the control signal $\phi_X$, $\phi_S$, $\phi_{SW}$ and $\phi_L$ which are raised in the order as shown in FIG. 14. After the change in $\overline{\text{WE}}$, the input data signal $D_{IN}$ is determined. In response to the rise of WE', the driver 801 in the circuit 608 is activated so that the state of the signals DB and $\overline{\text{DB}}$ are determined by the buffered data signal $D'_{IN}$ and the signals DB and $\overline{\text{DB}}$ are written into the selected memory cell 901 and thereafter the state (LB) of the latch circuit 610 is also determined in response to the rise of $\phi_L$ according to $D_{IN}$.

Thus, the write operation of $D_{IN}$ to the selected memory cell 901 is accomplished and the write enable signal $\overline{\text{WE}}$ is returned to the inactive level at a time point $t_2$.

Throughout the write operation, the selected word line Wi is maintained at the high level and DC current flows from Vcc to ground via one of the transistors $Q_{91}$ and the selected memory cell 901 in the respective bit line pairs and the sense amplifier 903 also consumes DC current in this period since the amplifier 903 is also enabled in response to $\phi_S$.

The current flowing through the sense amplifier 903 is unnecessary to the function of writing.

When the data written into the selected memory cell 901 is to be read, the selected word line Wi is deactivated to the low level and then the same word line Wi is selected again to produce the data written as the output signal $D_{OUT}$. Therefore, it has been necessary to perform the selection of the word line twice, resulting in a low speed operation and a large power consumption.

A memory circuit according to one embodiment of the present invention is explained with reference to FIGS. 15 to 17.

Figure 9:
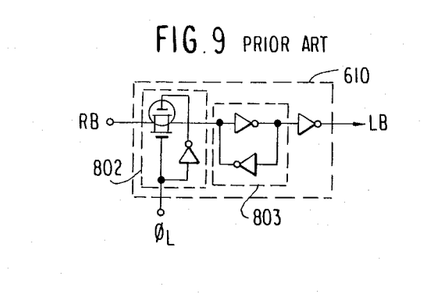
FIG. 9 is a schematic block diagram of a data latch circuit.
Figure 15:
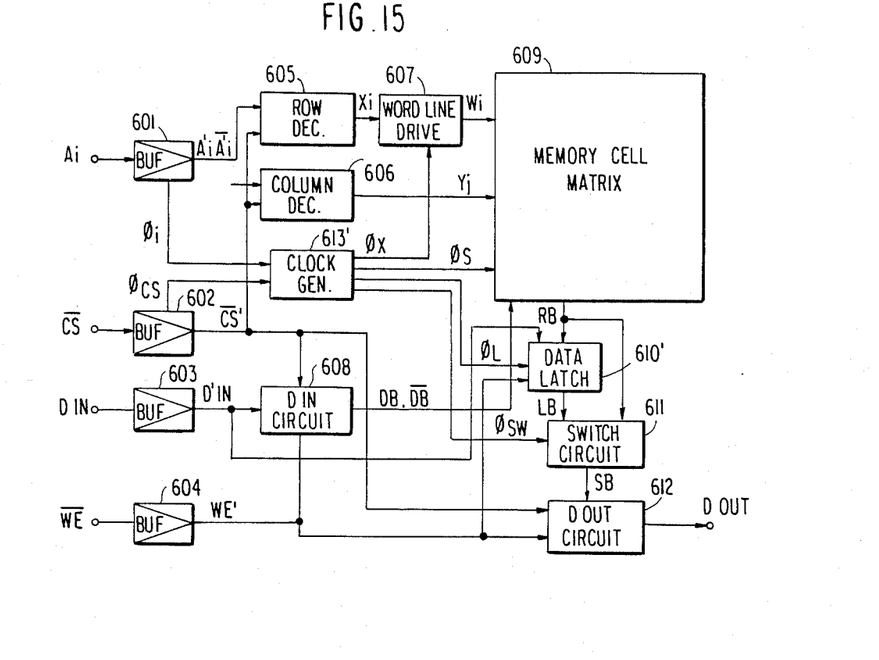
FIG. 15 is a schematic block diagram of a memory according to the present invention.

The present embodiment is achieved by replacing the clock generator 613 and the latch circuit 610 in FIGS. 1, 10 and 9 with a clock generator 613' and a latch circuit 610' as shown in FIG. 15. The latch circuit 610' receives the signal WE' and the buffered input signal D'$_{IN}$ in addition to $\phi_L$ and RB.

Figure 17:
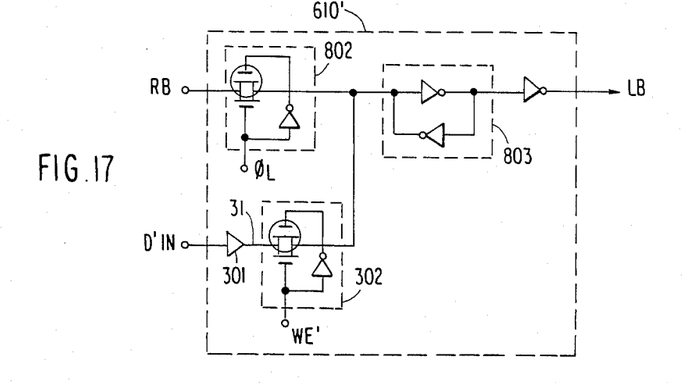
FIG. 17 is a schematic block diagram of a data latch section of the memory of FIG. 15.

The detailed structure of the latch circuit 610' is shown in FIG. 17. Specifically, as compared to the latch circuit 610 the latch circuit 610' further comprises a delay circuit having an input supplied with D'$_{IN}$ and a CMOS transfer gate 302 coupled between the output of the delay circuit 301 and the input of the latch circuit 803, in addition to the transfer gate 802 controlled by $\phi_L$ and the flip-flop 803. The transfer gate 302 is enabled to transmit D'$_{IN}$ to the flip-flop when WE' is at the high level.

Figures 16, 18:
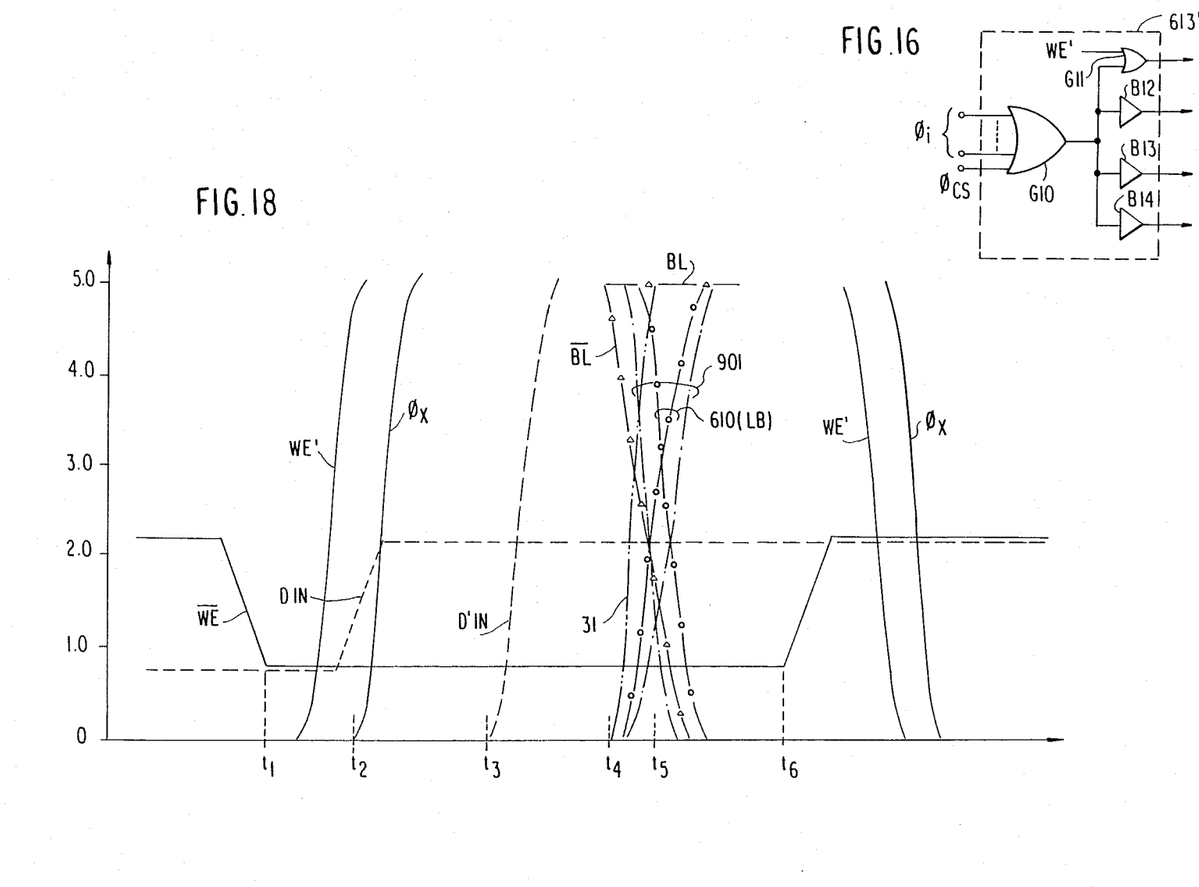
FIG. 16 is a schematic block diagram of a clock generator memory of FIG. 15.
FIG. 18 is a wave-form diagram showing an operation of the memory of FIG. 15.

The detailed structure of the clock generator 613' is shown in FIG. 16. The internal write enable signal WE' is not applied to an OR gate receiving the signals $\phi_i$ and $\phi_{CS}$ but is applied to an OR gate G11 receiving the output of the OR gate G10. The signal $\phi_X$ for enabling the word line driver 607 is generated from the OR gate G11.

A read operation of the circuit of FIG. 15 is the same as the memory of FIG. 1.

A write operation of the present embodiment is explained with reference to FIG. 18.

The write enable signal $\overline{WE}$ is changed from the inactive (high) level to the active (low) level at a time point $t_1$. Then, the signal WE' is raised and the state of the input data signal D$_{IN}$ is determined. In response to the rise of WE', the signal $\phi_X$ is generated from the OR gate G11 in the clock generator 613' at a time point $t_2$. In this instance, $\phi_S$, $\phi_L$ and $\phi_{SW}$ are all low in level. At a time $t_3$, the buffered input signal D'$_{IN}$ is generated by the buffer 603 and the circuit 608 determines the levels of DB and $\overline{DB}$ in accordance with the level of D'$_{IN}$ and the state of the bit lines BL, $\overline{BL}$ are determined at a time $t_4$ according to the D'$_{IN}$. Thus, the state of the selected memory cell 901 is determined in accordance with D'$_{IN}$ at a time $t_5$.

Meanwhile, at the time $t_4$, the delay circuit 301 in the latch circuit 610' produces at its output node 31 a delayed signal of D'$_{IN}$ and the output 31 of the delay circuit 301 is transferred to the flip-flop 803 via the transfer gate 302 enabled by WE' and held thereby. Thus, the same data written into the selected memory cell 901 is also stored in the flip-flop 803 in the latch circuit 610'.

Thus, the write operation to the selection memory cell is accomplished at a time $t_6$.

In the above embodiment, the delay time of the delay circuit is set at such value that the write to the selected memory cell and the determination of the state of the flip-flop 803 are accomplished simultaneously.

According to the above embodiment, the same data written to the selected memory cell is simultaneously latched by the latch circuit 610' and produced as the signal LB. Therefore, the data latched by the latch circuit 610' is produced as the output signal D$_{OUT}$ because the switch circuit 611 transmits the signal LB in response to the low level of $\phi_{SW}$.

Since the signal $\phi_S$ is maintained at the low level in the write operation, the sense amplifier 903 is not enabled, thus avoiding DC current flowing in the sense amplifier 903 and, resulting low power consumption in the write operation.

Moreover, the write data is outputted as D$_{OUT}$ in the write operation, thus it is not necessary to drive the selected word line again to read the written data.

Figure 19:
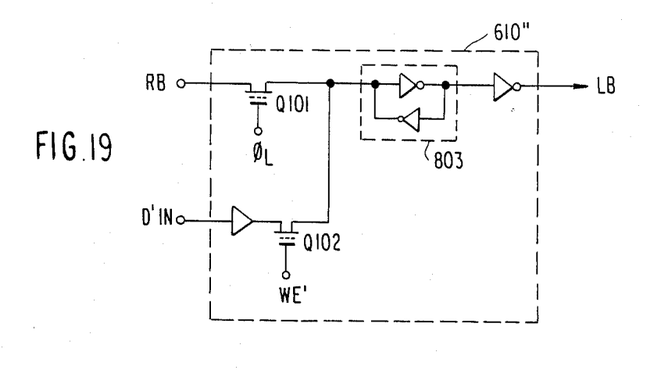
FIG. 19 is a block diagram of a data latch section as another example as employed in the memory of FIG. 15.
Figure 20:
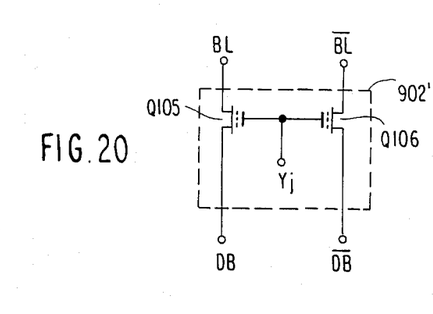
FIG. 20 is a diagram of a column selection circuit as another example, employed in the memory of FIG. 15.
Figure 21:
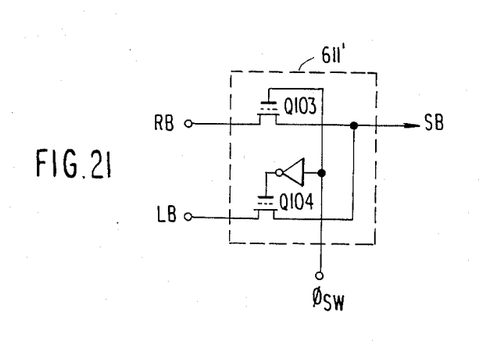
FIG. 21 is a schematic block diagram of a switching circuit, as another example, employed in the memory of FIG. 15.

FIGS. 19, 20 and 21 show another example of the latch circuit 610'', column selection circuit 902' and the switch circuit 611'. In the modified circuits 610'', 902' and 611', transistors Q101–Q106 have a small value of threshold voltage, such as 0.3 volts and they are employed as transfer gates in place of the CMOS transfer gates in the previous embodiment. The operations and functions of those circuits 610'', 902' and 611' are the same as the previously explained circuits 610', 902 and 611, respectively.

I claim:

1. A memory circuit comprising a memory cell array having a plurality of memory cells, means for selecting a memory cell in said memory cell array, a sense amplifier for amplifying a signal from the selected memory cell, means for receiving an input data signal to be stored, an input data buffer for generating an internal data signal in response to said input data signal, means for writing said internal data signal to the selected memory cell, a latch circuit having inputs coupled to said input data buffer and said sense amplifier and an output, a switch circuit coupled to said latch circuit, said sense amplifier and said input data buffer circuit for applying the output of said sense amplifier to said latch circuit in a read mode and said internal data signal to said latch circuit in a write mode, an output terminal, and means for determining a level of said output terminal in accordance with data held in said latch circuit.

2. The memory circuit according to claim 1, in which said memory cells are static memory cells.

3. The memory circuit according to claim 1, wherein said switch circuit includes a first transfer gate coupled between the output of said sense amplifier and said latch circuit, a second transfer gate coupled between the output of said data input buffer circuit and said latch circuit, means for enabling said first transfer gate in a read mode and means for enabling said second transfer gate in a write mode.

4. The memory circuit according to claim 1, further comprising means for generating a detection signal when an address signal is changed.

5. The memory circuit according to claim 1, further comprising means for receiving a write enable signal and control means for inhibiting an operation of said sense amplifier when said write enable signal is present.

* * * * *

UNITED STATES PATENT AND TRADEMARK OFFICE
CERTIFICATE OF CORRECTION

PATENT NO. : 4,858,188
DATED : August 15, 1989
INVENTOR(S) : Kobayashi

It is certified that error appears in the above-identified patent and that said Letters Patent is hereby corrected as shown below:

Column 3, line 14, delete "Ai',Ai' " and insert --Ai', $\overline{Ai'}$--;

Column 3, line 57, delete "CS'" and insert --$\overline{CS'}$--;

Column 4, line 1, delete "A'i, A'i" and insert --A'i, $\overline{A'i}$--;

Column 4, line 23, delete "sam" and insert --same--;

Column 5, line 10, delete "WE'~ and insert --$\overline{WE'}$--.

Signed and Sealed this

Fifteenth Day of May, 1990

Attest:

HARRY F. MANBECK, JR.

*Attesting Officer*     *Commissioner of Patents and Trademarks*